US00RE45232E

(19) United States
(12) Reissued Patent
Weon et al.

(10) Patent Number: US RE45,232 E
(45) Date of Reissued Patent: Nov. 4, 2014

(54) METHOD OF FORMING A CONTACT PLUG FOR A SEMICONDUCTOR DEVICE

(75) Inventors: Dae Hee Weon, Ichon-Shi (KR); Seok Kiu Lee, Ichon-Shi (KR)

(73) Assignee: Conversant IP N.B. 868 Inc., Saint John, NB (CA)

(21) Appl. No.: 13/568,920

(22) Filed: Aug. 7, 2012

Related U.S. Patent Documents

Reissue of:
(64) Patent No.: 6,472,303
Issued: Oct. 29, 2002
Appl. No.: 10/034,242
Filed: Dec. 28, 2001

(30) Foreign Application Priority Data

Oct. 8, 2001 (KR) ..... 2001-0061885

(51) Int. Cl.
*H01L 21/44* (2006.01)

(52) U.S. Cl.
USPC ..... 438/597; 438/607; 438/637; 438/675; 438/680; 257/E21.166; 257/E21.507

(58) Field of Classification Search
USPC ..... 438/597, 607, 637, 675, 680
See application file for complete search history.

(56) References Cited

U.S. PATENT DOCUMENTS 4,005,450 A 1/1977 Yoshida et al.
4,072,545 A 2/1978 DeLamondea
4,948,745 A 8/1990 Pfiester et al.
4,966,868 A * 10/1990 Murali et al. ..... 438/232
5,004,702 A 4/1991 Samata et al.
5,057,899 A * 10/1991 Samata et al. ..... 257/754
5,073,516 A 12/1991 Moslehi
5,273,921 A 12/1993 Neudeck et al.
5,291,058 A 3/1994 Samata et al.
5,321,285 A * 6/1994 Lee et al. ..... 257/296
5,321,306 A 6/1994 Choi et al.
5,434,092 A 7/1995 Neudeck et al.
5,444,278 A 8/1995 Katayama
5,455,198 A * 10/1995 Choi et al. ..... 437/192
5,475,240 A * 12/1995 Sakamoto ..... 257/67
5,604,368 A 2/1997 Taur et al.
5,652,180 A * 7/1997 Shinriki et al. ..... 437/190
5,804,470 A 9/1998 Wollesen
5,854,127 A * 12/1998 Pan ..... 438/629
5,895,948 A 4/1999 Mori et al.
5,955,759 A 9/1999 Ismail et al.

(Continued)

FOREIGN PATENT DOCUMENTS

JP 59082768 5/1984
JP 59165461 9/1984

(Continued)

OTHER PUBLICATIONS

Moon, et al., "A Deep-Submicrometer Raised/Drain LDD Structure Fabricated Using Hot-Wall Epitaxy", VLSITSA, pp. 117-121 (1991).

(Continued)

*Primary Examiner* — Alexander Ghyka

(57) ABSTRACT

A method of manufacturing a semiconductor device having the steps of forming an insulating layer on a silicon substrate, forming a contact hole on the insulating layer, forming a selective silicon layer in the contact hole, and forming a selective conductive plug on the selective silicon layer.

23 Claims, 6 Drawing Sheets

(56) References Cited

U.S. PATENT DOCUMENTS

| | | | | |
|---|---|---|---|---|
| 6,001,729 | A * | 12/1999 | Shinriki et al. | 438/625 |
| 6,030,891 | A | 2/2000 | Tran et al. | |
| 6,030,894 | A | 2/2000 | Hada et al. | |
| 6,090,691 | A | 7/2000 | Ang et al. | |
| 6,150,190 | A | 11/2000 | Stankus et al. | |
| 6,218,237 | B1 | 4/2001 | Sandhu et al. | |
| 6,271,125 | B1 * | 8/2001 | Yoo et al. | 438/637 |
| 6,372,630 | B1 * | 4/2002 | Uchiyama et al. | 438/624 |

FOREIGN PATENT DOCUMENTS

| | | |
|---|---|---|
| JP | 59165462 | 9/1984 |
| JP | 59165463 | 9/1984 |
| JP | 59165464 | 9/1984 |
| JP | 59165465 | 9/1984 |
| JP | 59189677 | 10/1984 |
| JP | 61006195 | 1/1986 |
| JP | 61164355 | 7/1986 |
| JP | 2130919 | 5/1990 |
| JP | 107219 | 4/1998 |

OTHER PUBLICATIONS

Hsieh et al., "Silicon Homoepitaxy by Rapid Thermal Processing Chemical Vapor Deposition (RTPCVD)-A Review," J. Electrochem. Soc., vol. 138, No. 4, pp. 1188-1207 (1991).

* cited by examiner

METHOD OF FORMING A CONTACT PLUG FOR A SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention generally relates to a method of manufacturing a semiconductor device, and more particularly, to a method of manufacturing a semiconductor device with an improved contact plug suitable for highly integrated semiconductor devices.

2. Description of the Related Art

As is well known, it is essential to reduce the contact resistance in a circuit line width to below 0.16 μm.

According to a recent method of forming a silicon contact plug, a contact hole is first formed and then, polycrystalline silicon is deposited therein. This method is performed by using a Chemical Mechanical Polishing (CMP) process.

Generally, it is desirable to apply selective epitaxial growth (SEG) during the manufacturing process of semiconductor devices since it is possible to reduce cell size, simplify manufacturing processes and improve electrical properties by using SEG.

Therefore, a plug using SEG can solve the problems of gap-fill and of undesirable increase of contact resistance.

Furthermore, it is possible to simplify the manufacturing process by using SEG since it does not require performing CMP and silicon recess etching for plug isolation.

However, there are several problems in applying SEG during plug manufacture.

First, there is a problem with the selectivity of the pattern material, that is, a material to form a window for growing the SEG.

Also, the surface of the nitride layer is exposed when the self-aligned contact (SAC) etch is applied to cell activation regions. The SEG has a different facet generation depending on the selectivity and the thermal stress of the pattern material.

Generally, in a low pressure chemical vapor deposition (LPCVD) process, the nitride materials have difficulty in achieving selectivity at a temperature below 850° C., as compared with oxide materials.

Therefore, the growth speed is lowered in order to have selectivity, thereby increasing the thermal budget on device.

The conventional method for manufacturing a semiconductor device will be described in more detail with reference to accompanying drawings.

FIGS. 1 to 4 are cross sectional views showing the steps of a conventional method of manufacturing semiconductor device.

Referring to FIG. 1, a gate electrode structure 3, having a hard mask (not shown) made of a nitride layer, is formed on a silicon substrate 1 and then, a sidewall spacer 5 is formed on the side of the gate electrode 3.

Although it is not shown in the drawings, impurity junction regions (not shown) are formed by impurities implanted in the silicon substrate 1 on the lower part of both sides of the sidewall spacer 5.

Subsequently, an interlayer insulating layer 7 is deposited by using an oxide layer material on the silicon substrate 1, including the gate electrode structure 3 and the sidewall spacer 5, in order to prevent the generation of short-circuits between adjacent cells.

Referring to FIG. 2, the interlayer insulating layer 7 is subjected to a landing plug contact mask formation process using a photolithography and patterning process to form a landing plug contact hole 9, which exposes the impurity junction regions (not shown), that is, a plug formation area.

Referring to FIG. 3, a polycrystalline silicon layer 11 is then deposited to fill the landing plug contact hole 9 on the upper part of the interlayer insulating layer 7, including the landing plug contact hole 9.

Referring to FIG. 4, a CMP or etch back process is performed on the polycrystalline silicon layer 11, thereby forming a contact plug 11a in the contact hole 9 to be in electrical contact with the impurity junction regions (not shown).

However, the conventional method has several problems in forming a contact hole and a contact plug having a high aspect ratio, wherein the circuit line width is below 0.16 μm.

In particular, one problem in the conventional contact formation process is to have a sufficient plug formation area by using a landing plug contact mask. That is, in the etching process to form a landing plug contact through SAC by a nitride layer spacer of the nitride layer barrier, the problem is that it is difficult to have a sufficient landing plug contact hole area due to the etching grade necessarily generated to have the etching selectivity ratio between the nitride layer of the gate spacer and the oxide layer of the interlayer insulating layer.

In order to solve the problem, SAC of selective single crystal silicon has been proposed as shown in FIG. 5.

FIG. 5 is a cross sectional view for showing the steps of a method of manufacturing a semiconductor device according to another embodiment of the conventional method.

Referring to FIG. 5, an isolation layer 23 is formed to define the device formation region on a silicon substrate 21 and a gate oxide layer 25. A gate 27 and a hard mask 29 are stacked on the device formation region of the silicon substrate 21, thereby obtaining a gate structure. Then, an insulating layer spacer 31 is formed on the upper part and side of the gate structure and at the same time, the silicon substrate 21 is exposed.

Then, a selective episilicon layer is grown over the height of the gate on the surface of the exposed silicon substrate 21, thereby forming a contact plug 33.

Afterwards, an interlayer insulating layer (not shown) is formed to electrically insulate the contact plug and then, additional processes (not shown) are performed.

However, this embodiment of the conventional method has several problems.

First, the allowable margin of the side is very low in the-episilicon growth process.

Therefore, as the device is formed having fine features, the distance between adjacent activation regions becomes shorter. The adhering episilicon layers thereby grow to the side from the adjacent activation regions.

In order to solve this problem, a method has been proposed whereby the episilicon layer is grown by using processes without side growth.

However, there are also several problems in applying the process without side growth.

When the episilicon is applied without side growth, the silicon of the activation region is formed in the shape of a "T" in order to form the contact plug, as shown in FIG. 6, part "A". According to this method, the side growth of episilicon is actively generated in a curved line. That is, the episilicon is generated in a direction other than in the directions 100 and 110.

FIGS. 7 and 8 are SEM photographs showing cells of direction 100 and cells slanting by 30°, respectively.

Compared with FIG. 7, the episilicon layer of FIG. 8 has the longer distance between activation regions. Therefore, side growth is actively generated and short-circuits may be caused between the adjacent activation regions.

However, it is very difficult to form activation regions in the shape of a "T" since the distance between the adjacent activation regions becomes shorter by the protruding part of the "T" and it is also difficult to form the cell in the shape of a "T" by using a photolithography process.

Furthermore, it is also difficult to obtain episilicon growth in a curved line.

In order to solve the above problems, a method is proposed whereby a contact is formed by a protruding part of a bit line. However, this is also very difficult to successfully perform.

SUMMARY OF THE INVENTION

Therefore, the present invention has been made to solve the above problems of the conventional method. The object of the present invention is to provide a method of manufacturing a semiconductor device capable of forming an improved contact plug suitable for highly integrated semiconductor devices.

Another object of the present invention is to provide a method of manufacturing a semiconductor device capable of simplifying the manufacturing process by applying episilicon growth during plug formation.

Yet another object of the present invention is to provide a method of manufacturing a semiconductor device capable of having a sufficient gap fill margin due to the low step in the deposition of the interlayer insulating layer and the margin due to the reduction of target in the contact etch processes.

Still another object of the present invention is to provide a method of manufacturing a semiconductor device capable of having a maximum allowable margin of side growth in the episilicon growth process.

In order to accomplish the above objects, the present invention comprises the steps of: forming an insulating layer on a silicon substrate; forming a contact hole on the insulating layer; forming a selective silicon layer in the contact hole; and selectively forming a conductive plug on the selective silicon layer.

The above objects, and other features and advantages of the present invention will become more apparent after a complete understanding of the following detailed description is achieved when taken in conjunction with the accompanying drawings.

DETAILED DESCRIPTION OF THE INVENTION

Figure 1:
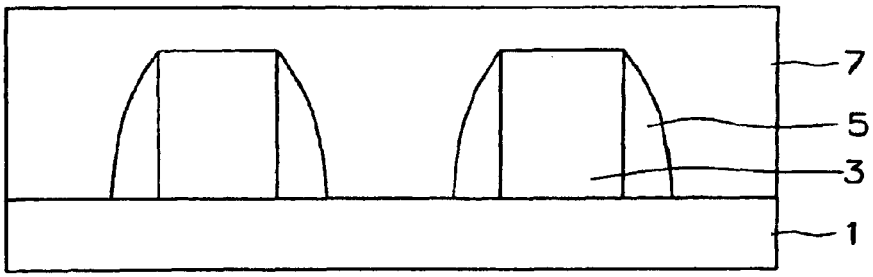
FIG. 1 (PRIOR ART)
FIGS. 1 to 4 are cross sectional views showing the steps of a conventional method of manufacturing a semiconductor device.
Figure 2:
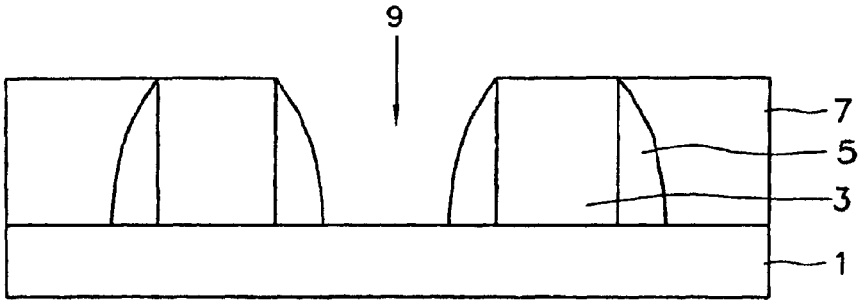
FIG. 2 (PRIOR ART)
Figure 3:
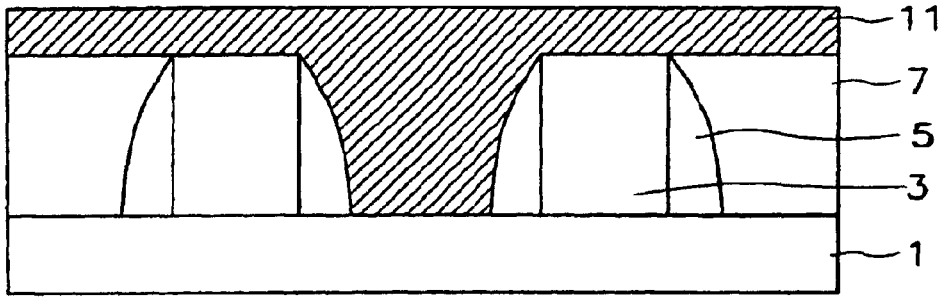
FIG.3 (PRIOR ART)
Figure 4:
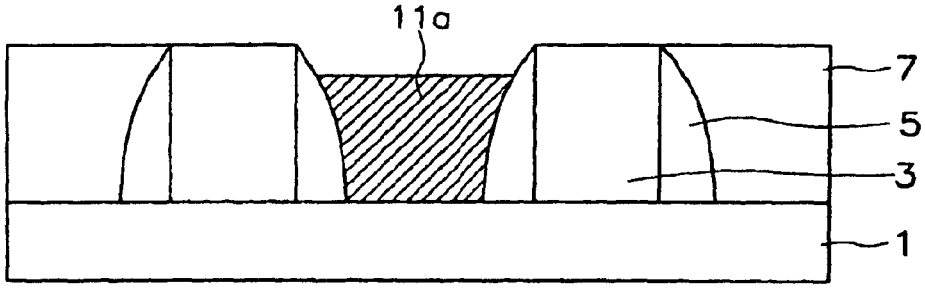
FIG.4 (PRIOR ART)
Figure 5:
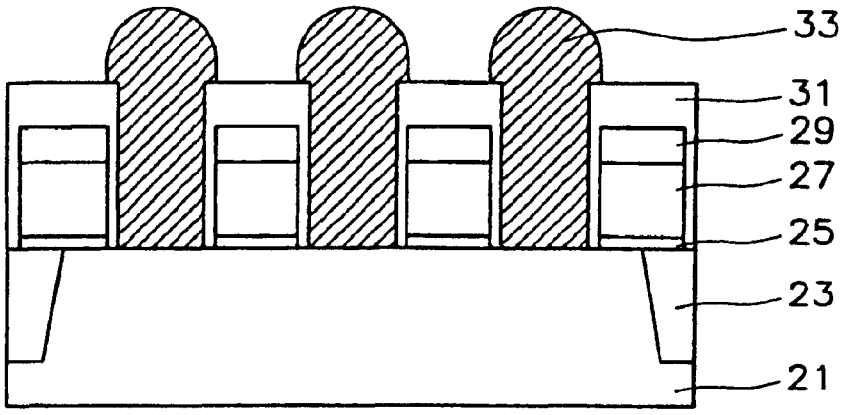
FIG.5 (PRIOR ART)
FIG. 5 is a cross sectional view showing the steps of a method of manufacturing a semiconductor device according to another embodiment using a conventional method.
Figure 6:
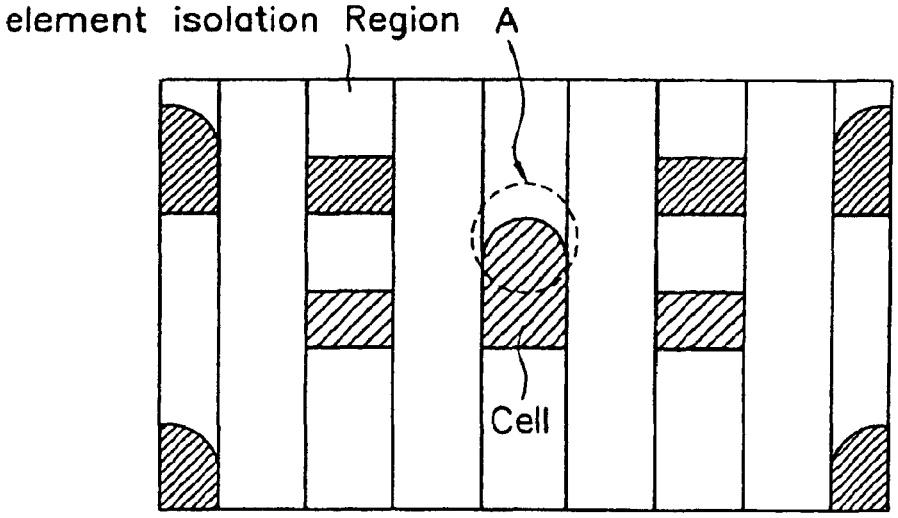
FIG.6 (PRIOR ART)
FIG. 6 is a plane view showing the steps of a method of manufacturing a semiconductor device according to another embodiment of the conventional method, wherein episilicon is grown toward the side.
Figure 7:
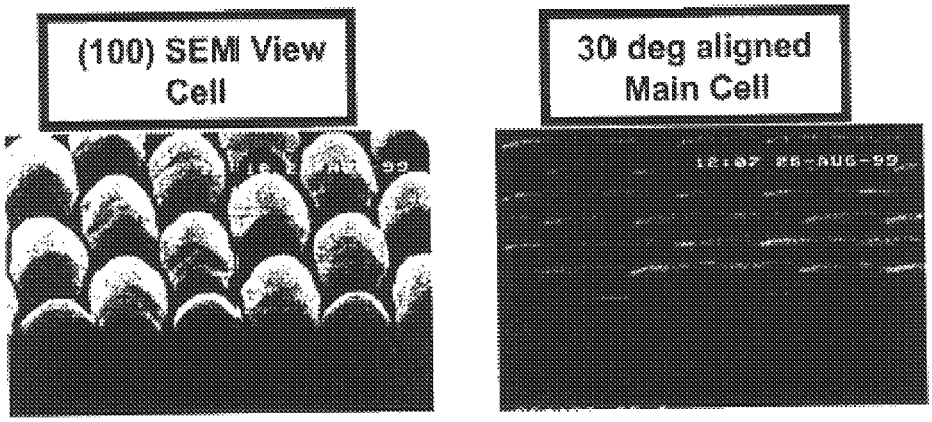
FIGS. 7 and 8 are SEM photographs showing side growth of episilicon according to directions of activation regions in the conventional method.
Figure 8:
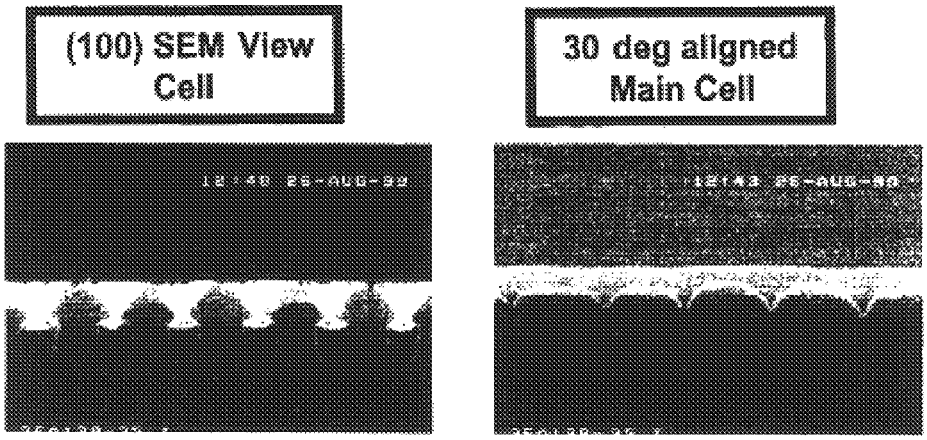

Although not shown in the drawings, an isolation layer (not shown) is first formed to define the device formation region and device isolation region on a silicon substrate 41.

Figure 9:
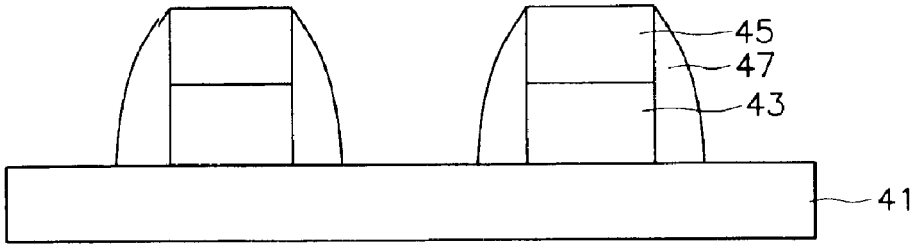
FIGS. 9 to 13 are cross sectional views showing the steps of a method of manufacturing a semiconductor device according to the present invention.

Then, as shown in FIG. 9, a gate insulating layer (not shown), a gate 43 and a hard mask 45 are formed on the device formation region of the silicon substrate 41. A nitride insulating layer (not shown) is deposited on the upper part of the silicon substrate 41, including over the gate 43. An insulting layer spacer 47 is then formed by selectively removing the nitride insulating layer by using an anisotropic etch process so that the insulating layer spacer 47 remains on the upper part and side part of the gate 43. The gate 43 is made of one or more of polycrystalline silicons having a thickness of between 500 and 1500 Å, or is made of tungsten having a thickness of between 500 and 1500 Å.

In the above process, the hard mask 45 and the insulating layer spacer 47 are formed as nitrides on the gate 43, in order to prevent damage to each layer during the etch process to form the landing plug contact hole.

Figure 10:
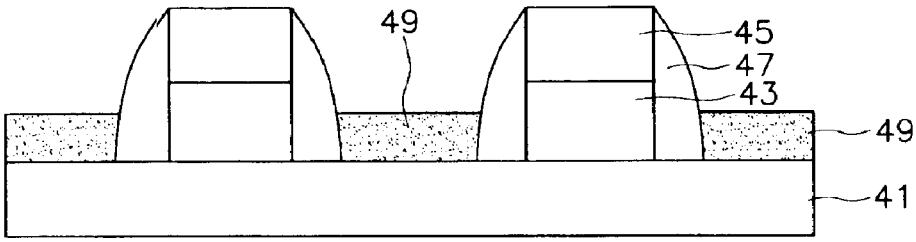

Referring to FIG. 10, a first episilicon layer 49 is grown on the exposed surface of the silicon substrate 41 on the lower parts of both sides of the insulating layer spacers 47 by performing selective episilicon growth processes. The first episilicon layer 49 is grown to a thickness of between 1500 and 2000 Å by using a known LPCVD process or UHVCVD process. The episilicon target is thereby lowered by the first episilicon layer 49 in the formation of the contact hole using SAC. Therefore, the allowable margin of growth is increased on the side of contact hole by slightly growing the episilicon layer.

The height of the activation regions is increased by between 1500 and 2000 Å after the first episilicon layer 49 is formed. Therefore, the area of the activation region is increased to have a sufficient etching margin in the landing plug etch process in consideration of the angle in landing plug contact etch process.

When the first episilicon layer 49 is grown by a LPCVD process, the H bake process is performed at a temperature of between 800 and 1000° C. for between 1 and 5 minutes and then, $SiH_2Cl_2$ gas and HCl gas are supplied at a rate of between 10 and 500 sccm at a pressure of between 5 and 300 Torr.

When the first episilicon layer 49 is grown by a UHVCVD process, the H bake process is performed at a temperature of between 400 and 800° C. and at a pressure of between 0.1 mTorr and 20 mTorr and, $Si_2H_6$ gas and $Cl_2$ gas are then supplied at a temperature of between 400 and 800° C. and at a pressure of between 0.1 mTorr and 100 Torr.

Figure 11:
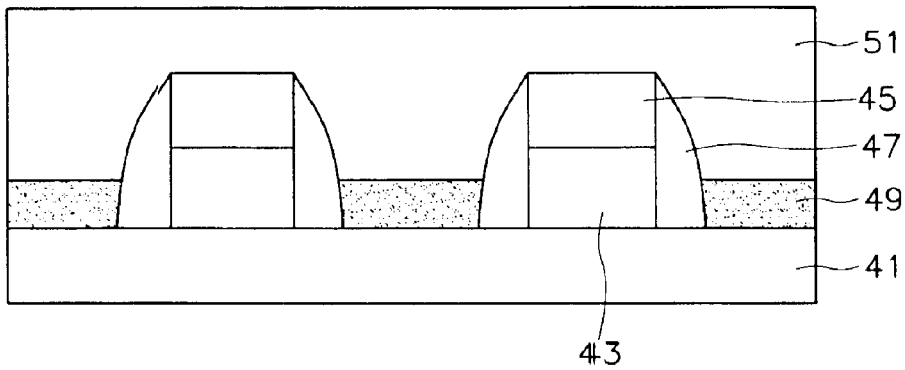

Referring to FIG. 11, an interlayer insulating layer 51 is deposited on the resulting structure including the first episilicon layer 49 to a thickness of between 3000 and 7000 Å. The interlayer insulating layer 51 is deposited by employing BPSG according to a LPCVD or PECVD method or by employing an oxide layer according to a HDPCVD method.

Although it is not shown in the drawings, a sensitive film (not shown) is applied on the interlayer insulating layer 51 and then, a sensitive film pattern for the landing plug contact mask (not shown) is formed by performing exposure and development processes using photolithography.

Figure 12:
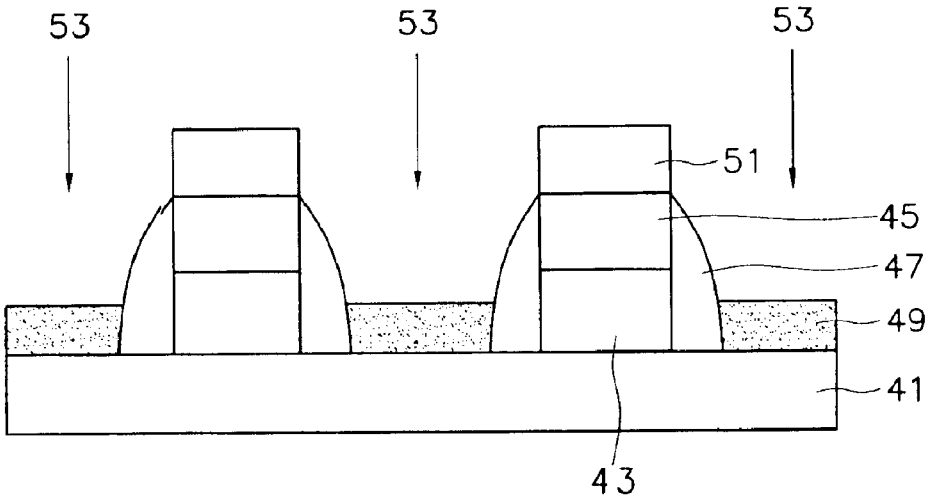

Referring to FIG. 12, the interlayer insulating layer 51 is selectively removed by employing the sensitive film pattern for the landing plug contact mask (not shown) as a mask, thereby forming a landing plug contact hole 53 exposing the first episilicon layer 49. Subsequently, the sensitive film pattern (not shown) is removed.

Figure 13:
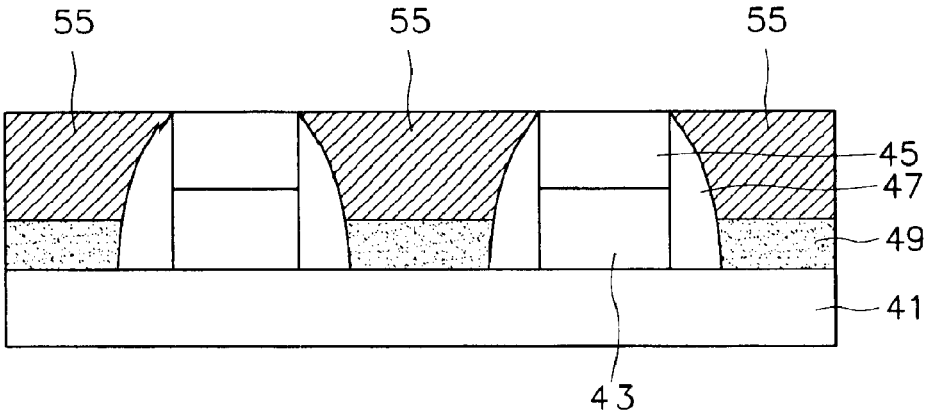

Referring to FIG. 13, a second episilicon layer 55 is grown on the first episilicon layer 49 on the lower parts of the landing plug contact hole 53. The second episilicon layer 55 is grown by using the same methods as that of the first episilicon layer 49. Alternatively, a doped amorphous silicon, polycrystalline silicon, titanium or other conductive metal layer is employed, instead of the second episilicon layer 55.

The polycrystalline silicon layer is formed by using a furnace or LPCVD of a single wafer. When the polycrystalline silicon layer is employed, a contact plug may be formed by performing planation on the polycrystalline silicon layer by CMP processes.

As described above, according to the present invention, a contact is easily formed by having a sufficient processing margin in the formation of a fine contact plug. That is, it is possible to have a sufficiently allowable margin of side growth in the episilicon growth process and to have a gap fill margin generated by the low step in the deposition of the interlayer insulating layer.

It is also possible to have a sufficient margin due to the reduction of target in etch processes to form the landing plug contact.

Although the preferred embodiment of this invention has been disclosed for illustrative purpose, those skilled in the art will appreciate that various modifications, additions and substitutions are possible, without departing from the scope and spirit of the invention.

What is claimed is:

1. A method of manufacturing a semiconductor device comprising the steps of:

forming an insulating layer on a silicon substrate;

forming a contact hole on the insulating layer;

forming a selective silicon layer in the contact hole; and forming a selective conductive plug on the selective silicon layer,

*wherein the selective silicon layer is an episilicon layer formed in accordance with an UHVCVD process,*

*wherein, in applying the UHVCVD, $SiH_2Cl_2$ gas and $Cl_2$ gas are supplied.*

2. The method of manufacturing a semiconductor device according to claim 1, further comprising the step of forming a gate on the silicon substrate prior to the step of forming the insulating layer.

3. The method of manufacturing a semiconductor device according to claim 2, wherein the gate is formed by one or more of polycrystalline silicons having a thickness of between 500 and 1500 Å, or tungsten having a thickness of between 500 and 1500 Å.

4. The method of manufacturing a semiconductor device according to claim 2, further comprising the step of forming a hard mask comprising nitride having a thickness of between 1000 and 3000 Å on the upper part of the gate.

5. The method of manufacturing a semiconductor device according to claim 4, wherein the hard mask comprising nitride is formed in accordance with an LPCVD process or a PECVD process.

6. The method of manufacturing a semiconductor device according to claim 2, further comprising the step of forming an insulating layer spacer comprising nitride having a thickness of between 100 and 500 Å on the side of the gate.

7. The method of manufacturing a semiconductor device according to claim 6, wherein the insulating layer spacer of nitride is formed in accordance with an LPCVD process or a PECVD process.

[8. The method of manufacturing a semiconductor device according to claim 1, wherein the selective silicon layer is an episilicon layer.]

9. The method of manufacturing a semiconductor device according to claim [8] *1*, wherein the episilicon layer is formed to a thickness of between 1500 and 2000 Å [in accordance with an LPCVD process or an UHVCVD process].

[10. The method of manufacturing a semiconductor device according to claim 9, wherein, in applying the LPCVD process, a H bake process is performed at a temperature of between 800 and 1000° C. for between 1 to 5 minutes.]

[11. The method of manufacturing a semiconductor device according to claim 9, wherein, in applying the LPCVD process, $SiH_2Cl_2$ gas and HCl gas are supplied at a rate between 10 and 500 sccm and at a pressure of between 5 and 300 Torr.]

12. The method of manufacturing a semiconductor device according to claim 9, wherein, in applying the UHVCVD process, a H bake process is performed at a temperature of between 400 and 800° C. and at a pressure of between 0.1 mTorr and 20 mTorr.

13. The method of manufacturing a semiconductor device according to claim 9, wherein, in applying the UHVCVD, *the* $SiH_2Cl_2$ gas and $Cl_2$ gas are supplied at a temperature of between 400 and 800° C. and a pressure of between 0.1 mTorr and 100 Torr.

14. The method of manufacturing a semiconductor device according to claim 1, wherein the insulating layer is a BPSG oxide layer or an unmixed oxide layer, having a thickness of between 3000 and 7000 Å.

15. The method of manufacturing a semiconductor device according to claim 1, wherein the selectively conductive plug comprises a layer of a material selected from a group comprising episilicon, polycrystalline silicon, titanium, and conductive metals.

16. The method of manufacturing a semiconductor device according to claim 15, wherein the selectively conductive plug has a thickness of between 1000 and 3000 Å.

*17. The method of claim 1, wherein the selectively conductive plug comprises a layer of titanium.*

*18. A method of manufacturing a semiconductor device comprising the steps of:*

*forming an insulating layer on a silicon substrate;*

*forming a contact hole on the insulating layer;*

*forming a selective silicon layer in the contact hole; and*

*forming a selective conductive plug on the selective silicon layer,*

*wherein the selective conductive plug comprises a layer of conductive metal; and*

*wherein the selective silicon layer is an episilicon layer formed in accordance with an UHVCVD process,*

*wherein, in applying the UHVCVD, $SiH_2Cl_2$ gas and $Cl_2$ gas are supplied.*

*19. The method of manufacturing a semiconductor device according to claim 18, further comprising the step of forming a gate on the silicon substrate prior to the step of forming the insulating layer.*

*20. The method of manufacturing a semiconductor device according to claim 19, wherein the gate is formed by one or more of polycrystalline silicons having a thickness of between 500 and 1500 Å, or tungsten having a thickness of between 500 and 1500 Å.*

*21. The method of manufacturing a semiconductor device according to claim 19, further comprising the step of forming*

*a hard mask comprising nitride having a thickness of between 1000 and 3000 Å on the upper part of the gate.*

*22. The method of manufacturing a semiconductor device according to claim 21, wherein the hard mask comprising nitride is formed in accordance with an LPCVD process or a PECVD process.*

*23. The method of manufacturing a semiconductor device according to claim 19, further comprising the step of forming an insulating layer spacer comprising nitride having a thickness of between 100 and 500 Å on the side of the gate.*

*24. The method of manufacturing a semiconductor device according to claim 23, wherein the insulating layer spacer of nitride is formed in accordance with an LPCVD process or a PECVD process.*

*25. The method of manufacturing a semiconductor device according to claim 18, wherein the episilicon layer is formed to a thickness of between 1500 and 2000 Å.*

*26. The method of manufacturing a semiconductor device according to claim 18, wherein the selectively conductive plug has a thickness of between 1000 and 3000 Å.*

* * * * *